(12) United States Patent
Zeng et al.

(10) Patent No.: US 9,190,569 B2
(45) Date of Patent: Nov. 17, 2015

(54) FLIP-CHIP LIGHT EMITTING DIODE AND FABRICATION METHOD

(71) Applicant: XIAMEN SANAN OPTOELECTRONICS TECHNOLOGY CO., LTD., Xiamen (CN)

(72) Inventors: Xiaoqiang Zeng, Xiamen (CN); Shunping Chen, Xiamen (CN); Qunfeng Pan, Xiamen (CN); Shaohua Huang, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 14/583,185

(22) Filed: Dec. 25, 2014

(65) Prior Publication Data

US 2015/0115295 A1 Apr. 30, 2015

Related U.S. Application Data

(63) Continuation of application No. PCT/CN2013/079843, filed on Jul. 23, 2013.

(51) Int. Cl.

| H01L 29/18 | (2006.01) |
|---|---|
| H01L 33/20 | (2010.01) |
| H01L 33/14 | (2010.01) |
| H01L 33/62 | (2010.01) |
| H01L 27/15 | (2006.01) |
| H01L 33/00 | (2010.01) |
| H01L 33/36 | (2010.01) |
| H01L 33/38 | (2010.01) |

(52) U.S. Cl.
CPC .............. *H01L 33/20* (2013.01); *H01L 27/15* (2013.01); *H01L 33/005* (2013.01); *H01L 33/145* (2013.01); *H01L 33/36* (2013.01); *H01L 33/62* (2013.01); *H01L 33/38* (2013.01); *H01L 2924/0002* (2013.01); *H01L 2933/0016* (2013.01)

(58) Field of Classification Search
CPC ....... H01L 33/145; H01L 33/62; H01L 33/20; H01L 33/005; H01L 33/36; H01L 33/38; H01L 33/08; H01L 33/24
See application file for complete search history.

(56) References Cited

U.S. PATENT DOCUMENTS

2006/0223211 A1* 10/2006 Mishra et al. .................. 438/41
2009/0267085 A1* 10/2009 Lee et al. ........................ 257/88

* cited by examiner

*Primary Examiner* — Khiem D Nguyen
(74) *Attorney, Agent, or Firm* — Syncoda LLC; Feng Ma

(57) ABSTRACT

A flip-chip light emitting diode (LED) includes: a substrate having a P-type pad electrode and an N-type pad electrode; a light-emitting epitaxial layer flip-chip mounted over the substrate, including, from top down, an n-type semiconductor layer, an active layer, and a p-type semiconductor layer. The n-type semiconductor layer is divided into a light-emitting region, an isolation region, and an electrode region. The light-emitting region and the electrode region are electrically isolated by the isolation region. The active layer and the p-type semiconductor layer are below the light-emitting region. The p-type semiconductor layer connects with the P-type pad electrode. The electrode region of the n-type semiconductor layer connects with the N-type pad electrode. A conductive connection portion on the n-type semiconductor layer connects the electrode region of the n-type semiconductor layer and the light-emitting region, realizing vertical current injection into the light-emitting epitaxial layer when an external power is connected.

17 Claims, 15 Drawing Sheets

FLIP-CHIP LIGHT EMITTING DIODE AND FABRICATION METHOD

CROSS-REFERENCE TO RELATED APPLICATIONS

The present application is a continuation of, and claims priority to, PCT/CN2013/079843, filed Jul. 23, 2013, which claims priorities to Chinese Patent Application No. CN 201210314573.2, filed Aug. 30, 2012. The disclosures of the above applications are hereby incorporated by reference in their entirety.

BACKGROUND

Among solid-state light emitting devices, light-emitting diodes (LEDs) have electrical and optical advantages such as low energy consumption, long service life, good stability, small size, fast response, and stable luminous wave length. LEDs and related light-emitting systems are widely used in fields such as illumination, household appliances, displays and signage. This type of light-emitting devices and systems have had remarkable progress in improved lighting efficiency and service life, and therefore are promising to become the mainstream for a new generation of lighting.

To improve light-emitting efficiency of the LED, a substrate transfer technology has been developed in recent years. The transfer processes may include: depositing a GaN-based thin film over a sapphire substrate via MOCVD, bonding the GaN-based thin film to the semiconductor or metal base using wafer bonding technology or electroplating technique, and removing the sapphire substrate using laser lift-off (LLO) method; and fabricating the device into a vertical structure. FIG. 1 is a structural diagram of a conventional vertical LED, comprising: a conductive substrate 100, a light-emitting epitaxial layer including a p-type semiconductor layer 121, an active layer 122 and an n-type semiconductor layer formed on the conductive substrate 100 via a high-reflection P-type conductive bonding layer 110, thereby forming a vertical structure LED with current injection into an N electrode 131 and a back electrode 132. In packaging this LED device, in general, welding is performed with silver paste die bonding or Au—Sn eutectic soldering. The N electrode is to be wire bonded to a support structure, and the N electrode on the light-emitting surface blocks a large amount of emitting light and is detrimental to light extraction.

SUMMARY

To solve the above problems, the present disclosure provides a light emitting diode (LED) of which the light-emitting surface has no pad electrode and fabrication method. In comparison to traditional vertical LED, the N electrode is dropped-down to the support substrate, which is good for packing and wire bonding and for improving wire bonding stability. Since the pad electrode is not on the light-emitting surface, the light blocking problems of the N-type electrode in traditional structure can be solved.

In accordance with a first aspect of the present disclosure, a flip-chip LED, comprising a substrate, on which distributed a P-type pad electrode and an N-type pad electrode; a light-emitting epitaxial layer flip-chip mounted on the substrate, comprising top-down an n-type semiconductor layer, an active layer and a p-type semiconductor layer, in which, the n-type semiconductor layer is divided into a light-emitting region, an isolation region and an electrode region, wherein, the light-emitting region and the electrode region are electrically isolated via the isolation region; the active layer and the p-type semiconductor layer are below the light-emitting region; the p-type semiconductor layer connects with the P-type pad electrode; and the electrode region of the n-type semiconductor layer connects with the N-type pad electrode; and a conductive connection portion on the n-type semiconductor layer, which connects the electrode region of the n-type semiconductor layer and the light-emitting region, thereby realizing vertical current injection into the light-emitting epitaxial layer when the external power is connected.

Preferably, the isolation region forms around the electrode region to ensure complete electrical isolation between the electrode region and the light-emitting region.

Preferably, the isolation region of the n-type semiconductor layer forms an insulation portion via ion injection to realize electrical isolation between the light-emitting region and the electrode region.

Preferably, the n-type semiconductor layer in the electrode region connects with the N-type pad electrode on the substrate via a bonding metal layer.

Preferably, the p-type semiconductor layer corresponding to the bottom of the n-type semiconductor layer in the electrode region forms short circuit connection with the active layer, so as to connect the n-type semiconductor layer in the electrode region and the N-type pad electrode on the substrate.

Preferably, the conductive connection portion is a transparent conductive layer. Further, a current expansion structure can be formed on the transparent conductive layer to further control even distribution of current. Further, a low-refraction passivation layer can be fabricated on the transparent conductive layer to protect the transparent conductive layer and to eliminate total reflection of light emitting, which is good for light to escape from the device. Further, a light-extraction structure can be fabricated on the surface of the n-type semiconductor layer. The transparent conductive layer forms on the light-extraction structure, which can further improve luminous efficiency.

Preferably, an electrode expansion structure can be formed on the surface of the n-type semiconductor layer of the light-emitting region via ion injection to effectively promote even distribution of current.

In accordance with a second aspect of the present disclosure, a fabrication for a flip-chip LED, comprising: 1) providing a growth substrate, on which growing a light-emitting epitaxial layer via epitaxial growth, which comprises bottom-up an n-type semiconductor layer, an active layer and a p-type semiconductor layer; 2) dividing the n-type semiconductor layer into a light-emitting region, an isolation region and an electrode region. Insulate the n-type semiconductor layer in the isolation region via ion injection to realize electrical isolation between the light-emitting region and the electrode region; 3) fabricating an N-type bonding metal layer on the n-type semiconductor layer in the electrode region and a P-type bonding metal layer on the p-type semiconductor layer; 4) providing a substrate, on which, fabricating a P-type pad electrode and an N-type pad electrode; 5) bonding the light-emitting epitaxial layer over the substrate, wherein, the N-type bonding metal layer connects with the N-type pad electrode and the P-type bonding metal layer connects with the P-type pad electrode; 6) removing the growth substrate and exposing the surface of the n-type semiconductor layer; 7) fabricating a conductive connection portion on the surface of the n-type semiconductor layer, which connects the electrode region of the n-type semiconductor layer and the light-emitting region, thereby realizing vertical current injection into the light-emitting epitaxial layer when the external power is connected.

In this fabrication method, the N-type bonding metal layer in Step 3) is of same height with the P-type bonding metal layer. When removing the growth substrate, take surface acid pickling, fabrication of current expansion structure, roughening, dry etching and other operations for the n-type semiconductor layer over the n-type surface.

In comparison to traditional vertical structure chip, embodiments disclosed herein may have one or more advantages such as that the light-emitting surface has no pad electrode and the uniplanar P electrode and the N electrode are on the insulating substrate, which effectively improves packing, die bonding and wire bonding yield; in addition, by fabricating the current blocking layer, roughening the n-type epitaxial surface and adding the passivation layer over the light-emitting surface, the external quantum efficiency of the grain can be further improved.

100: conductive substrate; 110: high-reflection P-type conductive bonding layer; 121: p-type semiconductor layer; 122: active layer; 123: n-type semiconductor layer, 131: N electrode; 132: back electrode; 200: growth substrate; 211: p-type semiconductor layer; 212: active layer; 213: n-type semiconductor layer; 213a: electrode region; 213b: isolation region; 213c: light-emitting region; 221: P-type bonding metal layer; 222: N-type bonding metal layer; 230: insulation and transmitting material; 240: substrate; 241: 242: metal bonding layer; 250: transparent conductive layer; 260: current expansion structure; 271: P-type pad electrode; 272: N-type pad electrode; 280: passivation layer.

DETAILED DESCRIPTION

The following embodiments disclose a light emitting diode (LED) of which the light-emitting surface has no pad electrode and fabrication method, in which, the n-type semiconductor layer is divided into a light-emitting region, an isolation region and an electrode region, wherein, the light-emitting region and the electrode region are electrically isolated via the isolation region. In some preferable embodiments, part of the n-type semiconductor layer can be insulated via ion injection to isolate the electrode region from the light-emitting region. The light-emitting surface of the light-emitting element can be exposed via die bonding, LLO, etc. A transparent conductive layer can be adopted to connect two ends of the insulating isolation region of ion injection to enable the current to flow into the active regions according to the set structure, thus forming a light emitting diode (LED) of which the light-emitting surface has no pad electrode.

Detailed description will be given to the present invention in combination with the embodiments.

Figure 1:
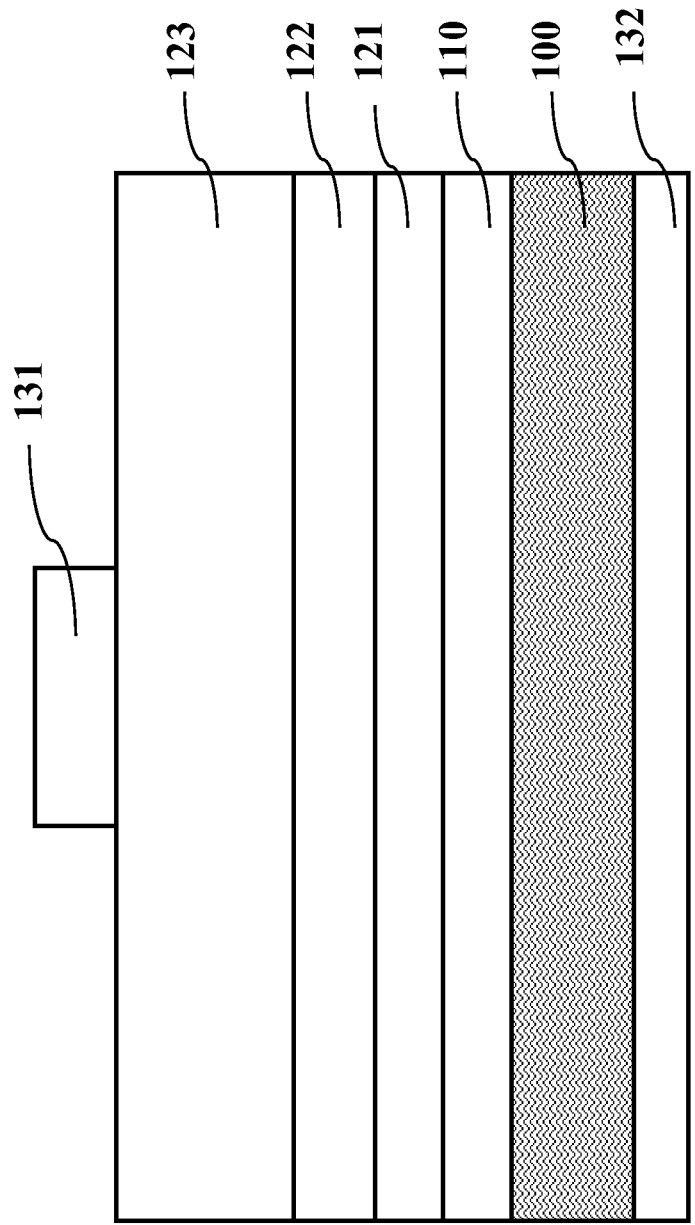
FIG. 1 is a cross sectional view of a conventional vertical light emitting element.
Figure 2:
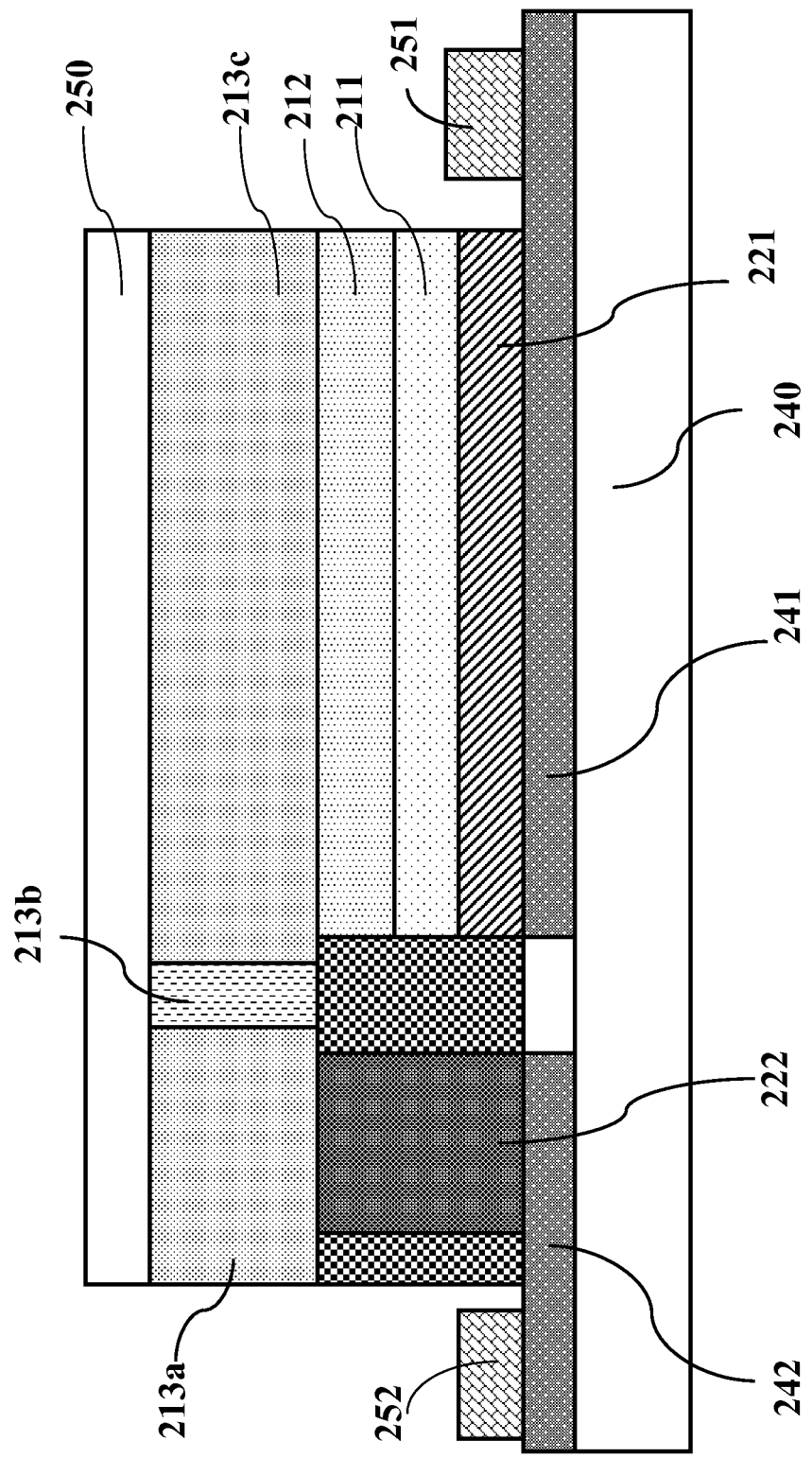
FIG. 2 is a side sectional view of a first embodiment of the present disclosure.

As shown in FIG. 2, a flip-chip LED, comprising a permanent substrate 240; a light-emitting epitaxial layer flip-chip mounted over the substrate 240, which comprises a p-type semiconductor 211, an active layer 212 and an n-type semiconductor layer 213, in which, the n-type semiconductor layer 213 is divided into an electrode region 213a, an isolation region 213b and a light-emitting region 213c, wherein, the isolation region 213b insulates the n-type semiconductor layer via ion injection, for electrical isolation in the electrode region 213a and the light-emitting region 213c; a transparent conductive layer 250 formed on the surface of the n-type semiconductor layer, which serves as a conductive connection portion to connect the electrode region of the n-type semiconductor layer 213a and the light-emitting region 213c.

The permanent substrate 240 is an insulating substrate, on which distributed metal bonding layer patterns 241, 242, a P-type pad electrode 271 and an N-type pad electrode 273, wherein, the metal bonding layer 241 connects with the P-type pad electrode 271 and the metal bonding layer 242 connects with the N-type pad electrode 272. In general, an insulating isolation layer can be filled in the metal bonding layer patterns, the height of which is same with the metal bonding layer.

The n-type semiconductor layer 213 is divided into an electrode region 213a, an isolation region 213b and a light-emitting region 213c, wherein, the isolation region 213b locates around the electrode region 213a to guarantee complete electrical isolation between the electrode region 213a and the light-emitting region 213c. The p-type semiconductor layer 211 and the active layer 212 are below the n-type semiconductor layer 213c of the light-emitting region. The p-type semiconductor layer 211 is bonded with the substrate 240 via the high-reflection P-type bonding metal layer 221 and the metal bonding layer 241. The n-type semiconductor layer 213a in the electrode region is bonded with the substrate 240 via the N-type bonding metal layer 222 and the metal bonding layer 242. An insulation and transmitting material 230 can be filled around the N-type bonding metal layer 222 to assist the bonding metal in supporting the entire epitaxial layer and guaranteeing electrical isolation between the N-type bonding metal layer 222 and the p-type semiconductor layer 211 as well as between the active layer 212 and the P-type bonding metal layer 221.

The transparent conductive layer 250, made up of transparent conducting material (e.g., ITO), forms over the n-type semiconductor layer 213 and connects with the electrode region 213a and the light-emitting region 213c, realizing electrical connection between the n-type semiconductor layer in the main light-emitting region and the n-type semiconductor layer in the electrode region, thereby guaranteeing vertical current injection into the light-emitting epitaxial layer.

Detailed descriptions will be given to the fabrication method for the flip-chip LED as shown in FIGS. 3-10.

Figure 3:
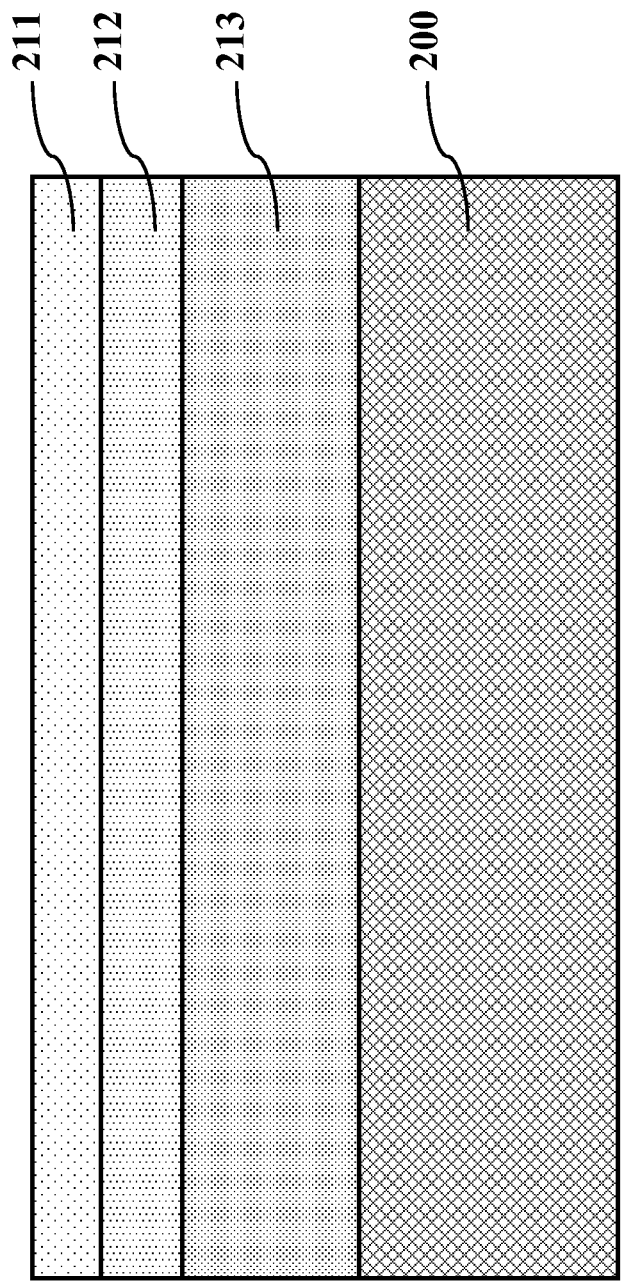
FIG. 3 is schematic diagram of a first step in the fabrication process for the LED as shown in FIG. 2.

As shown in FIG. 3, successively grow n-type semiconductor layers 213 and 304, an active layer 212 and a p-type semiconductor layer 211 over the growth substrate 700 (e.g., sapphire) via MOCVD.

Figure 4:
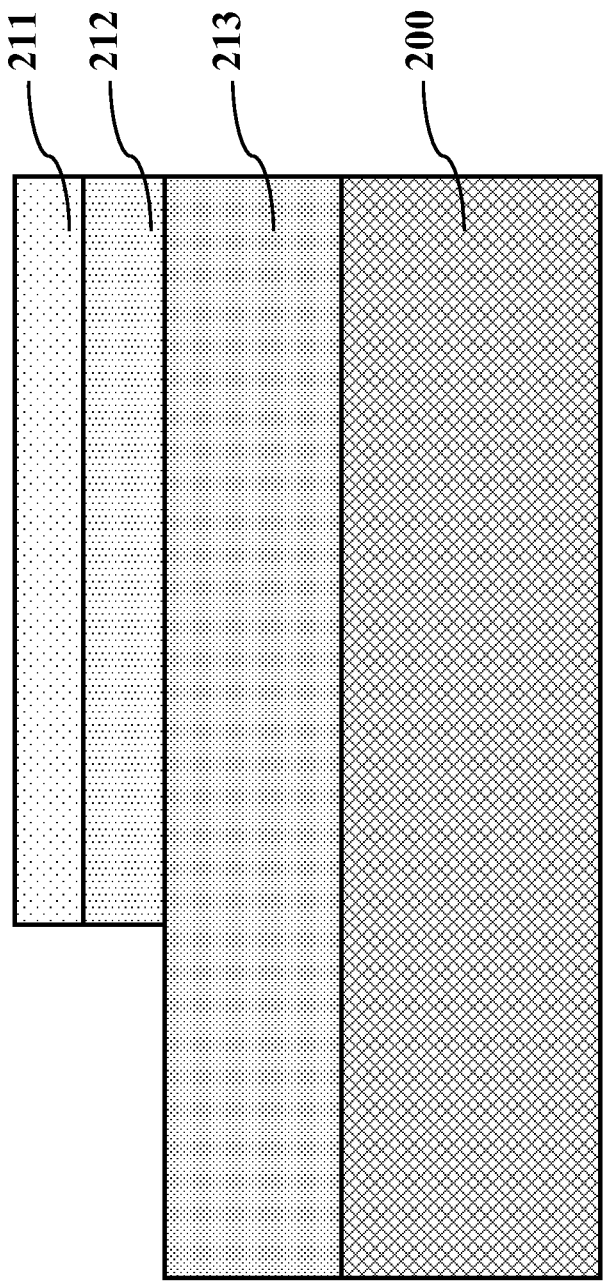
FIG. 4 is schematic diagram of a second step in the fabrication process.

As shown in FIG. 4, define the mesa and expose part of the n-type semiconductor layer 213. The detailed processes are as follows: protect most part of the P-type semiconductor layer 211 via photomask patterning, and expose the n-type semiconductor layer 213 via ICP dry etching with preferable etching depth of 1 um.

Figure 5:
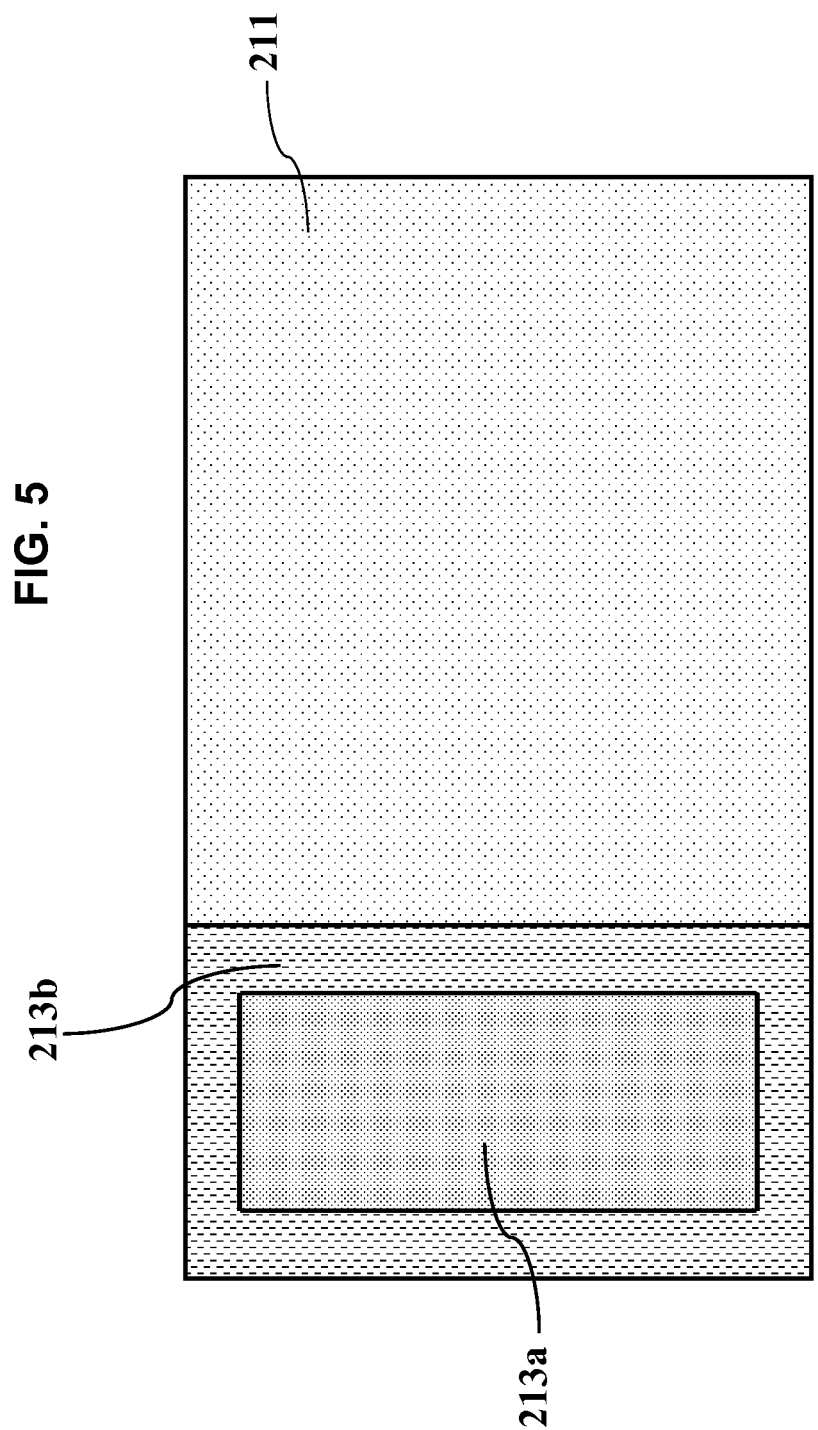
FIG. 5 is schematic diagram of a third step in the fabrication process.
Figure 6:
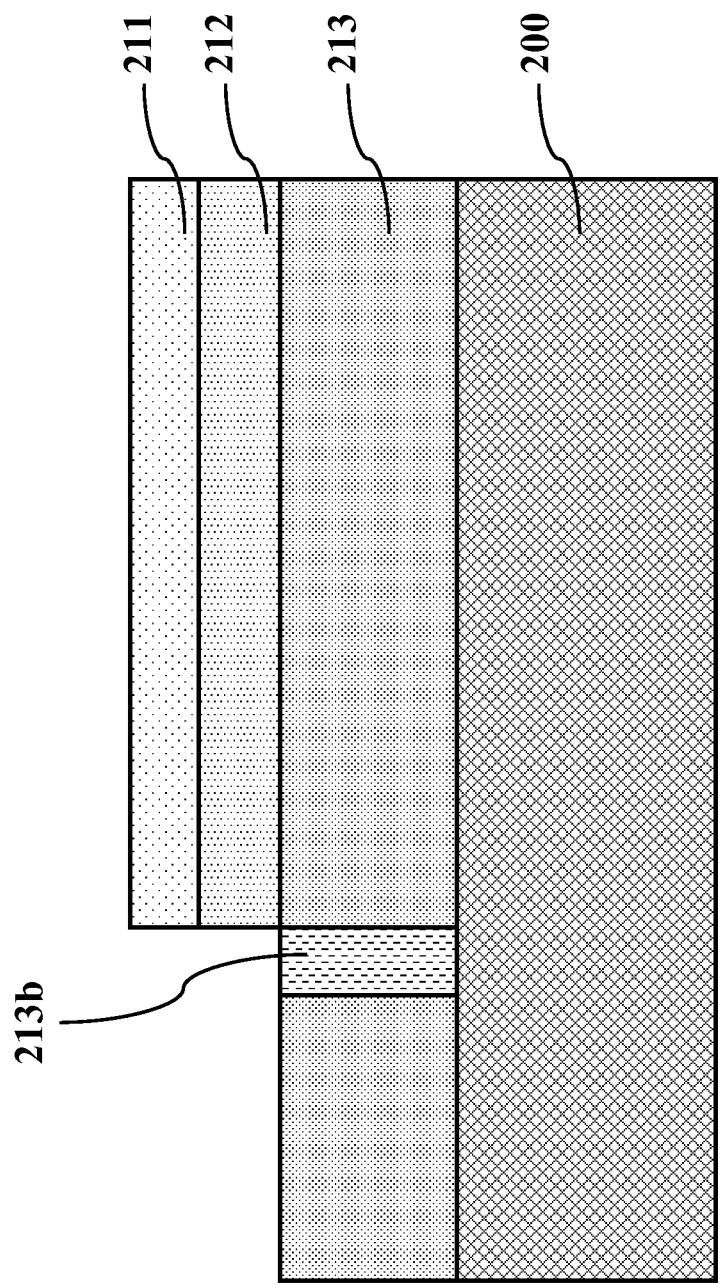
FIG. 6 is schematic diagram of a fourth step in the fabrication process.

As shown in FIG. 5, divide the n-type semiconductor layer into an electrode region 213a, an isolation region 213b and a light-emitting region 213c. As shown in FIG. 6, define the electrode region 213a and the isolation region 213b over the exposed mesa of the n-type semiconductor layer. Insulate the n-type semiconductor layer in the isolation region into an isolation portion via ion injection. The n-type semiconductor layer portion covered by the p-type semiconductor layer and the active layer is the light-emitting region. The detailed processes are as follows: inject ions into the upper portion 213b of the exposed n-type semiconductor layer for passivating and insulating the n-type semiconductor layer via photomask patterning and ion injection till the growth substrate. The injected ion can be N ion, Ar ion, O ion or any of their combinations.

Figure 7:
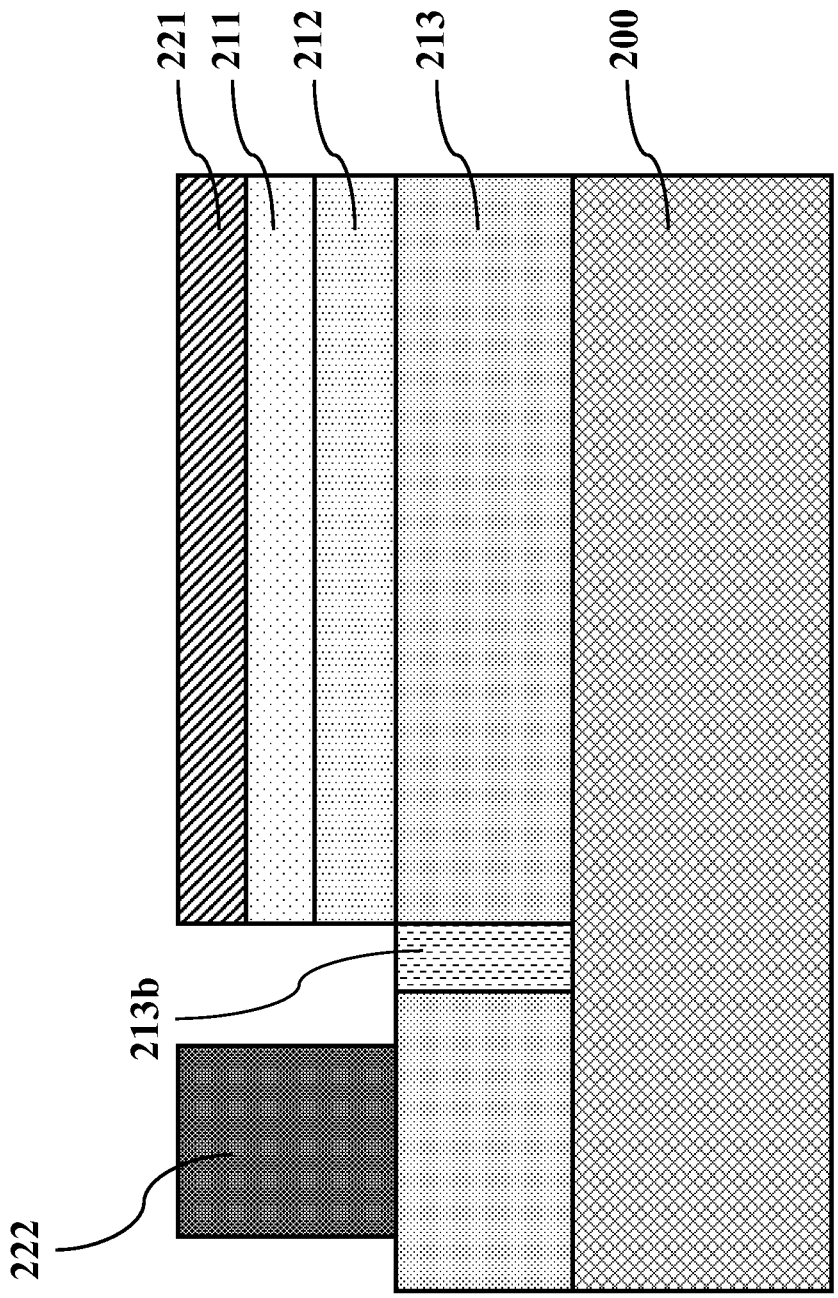
FIG. 7 is schematic diagram of a fifth step in the fabrication process.

As shown in FIG. 7, fabricate a patterned high-reflection bonding metal layer 221 over the p-type semiconductor layer 211 and an N-type bonding metal layer 222 over the n-type semiconductor layer 213a in the electrode region. The detailed processes are as follows: expose the region to be fabricated with the high-reflection bonding metal layer 221 via photomask patterning. Evaporate the high-reflection bonding metal layer 221 via EBE evaporation coating. The high-reflection bonding metal layer may comprise Ag, Ni, Al, Pt, Au, Ti or any of their combinations. The total thickness is not less than 1 um and the preferable thickness is 2 um. Expose the n-type semiconductor layer 213a in the electrode region via photomask patterning. Evaporate the N-type bonding metal layer 222 via EBE evaporation coating. The bonding metal layer may comprise Ag, Ni, Al, Pt, Au, Ti or any of their combinations. The total thickness is not less than 2 um and the preferable thickness is 3 um.

Figure 8:
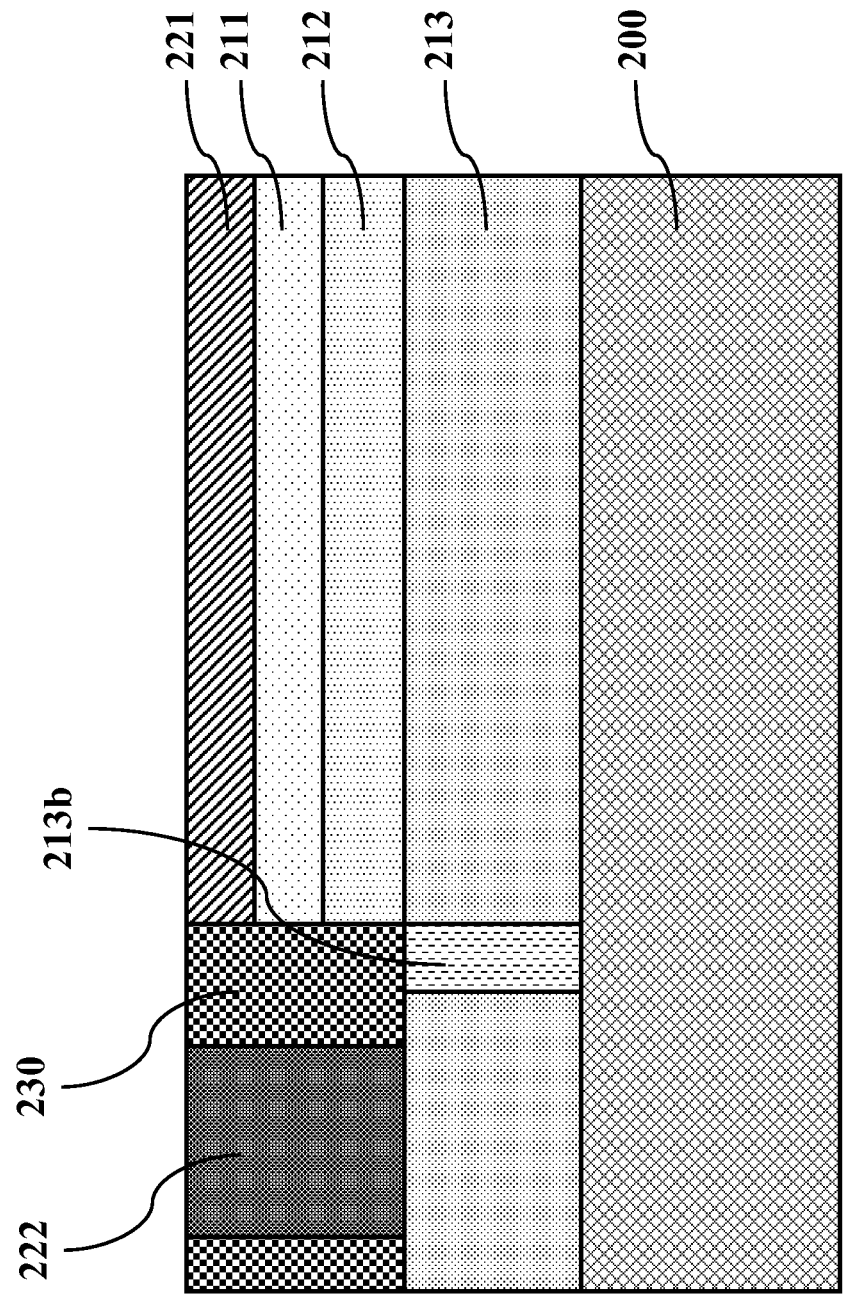
FIG. 8 is schematic diagram of a sixth step in the fabrication process.

As shown in FIG. 8, fill in the insulated and transmitting filling material 230 around the N-type bonding metal layer 222. The filling material can be SOG, BCB, etc. The filling is as high as the N-type bonding metal layer 222 and the high-reflection P-type metal bonding layer 201. Thin the growth substrate 200 and divide grains via laser scribing and breaking machine for backup.

Provide a permanent insulating substrate 240, on which grow an insulating layer 243 via PECVD, which may be $SiO_2$, $SiN_x$, $SiO_xN_y$ or any of their combinations. The thickness is not less than 0.5 um and the preferable thickness is 1 um; Pattern the insulating material via photomask patterning and etch the insulating material via chemical wet etching. Evaporate bonding metal layers 241, 242 as thick as the insulating layer 130 via EBE evaporation coating. The metal layer may comprise Cr, Ag, Ni, Al, Pt, Au, Ti or any of their combinations. Wherein, the bonding metal layer 241 is isolated from the bonding metal layer 242 via the insulating layer 130, forming electrical isolation; fabricate a P-type pad electrode 271 over the bonding metal layer 241 and an N-type pad electrode 272 over the bonding metal layer 242.

As shown in FIG. 8, permanently bond the backup grains on the insulating substrate 240 via die bonding. Specific processes are as follows: align and bond the high-reflection P-type bonding metal layer 221 with the bonding metal layer 241 on the permanent substrate 240. At the same time, align and bond the N-type bonding metal layer 242 with the bonding metal layer 242 on the permanent substrate 240.

Figure 9:
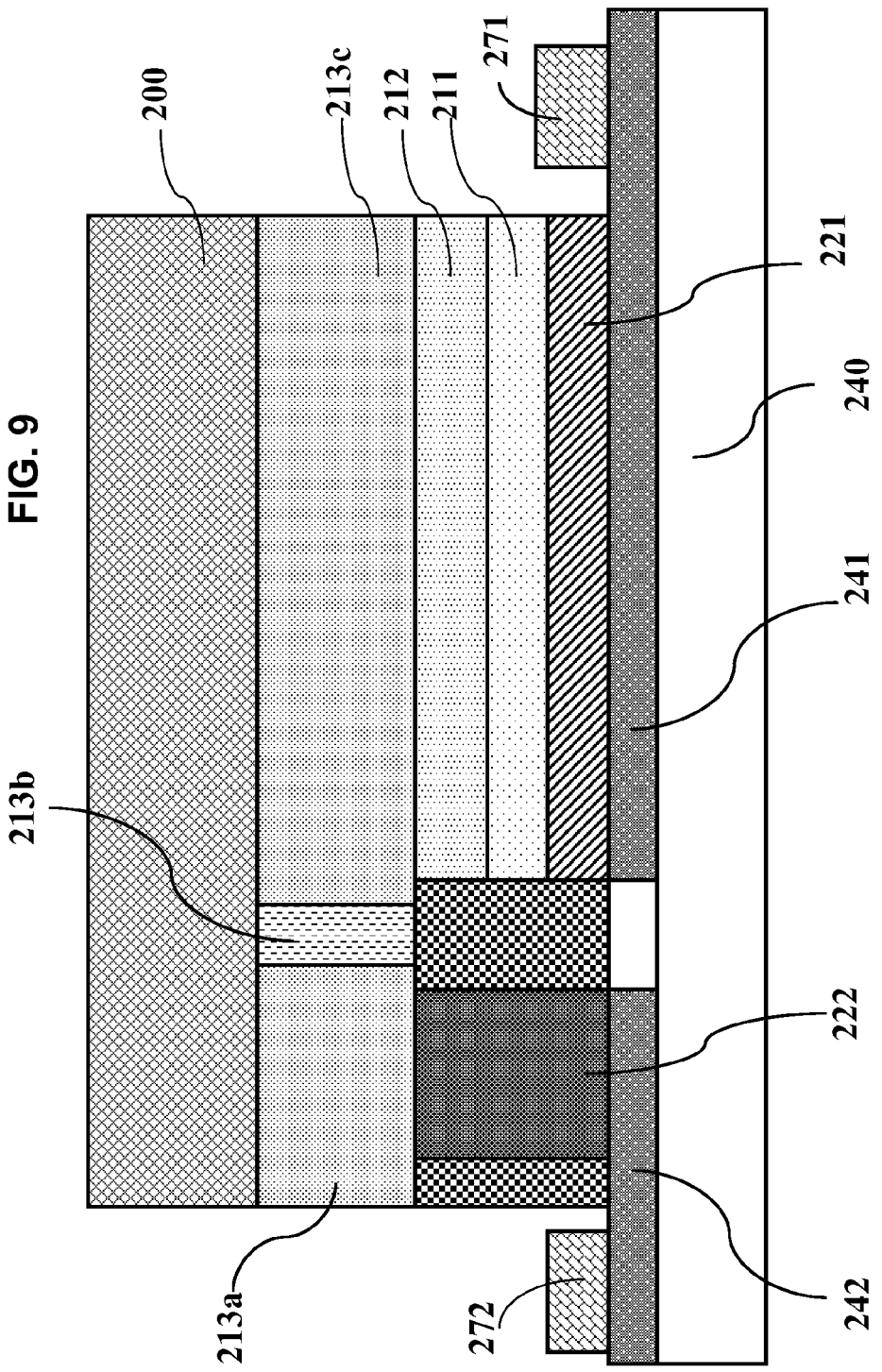
FIG. 9 is schematic diagram of a seventh step in the fabrication process.

As shown in FIG. 9, adopt a 248 nm KrF excimer laser to lift off the growth substrate 200. Clean the remained Ga metal after LLO with hydrochloric acid. In this way, the n-type semiconductor layer 213c in the light-emitting region, the n-type semiconductor layer 213b in the electrode region and the electrically-isolated insulation region 213b expose on the surface at the same time.

Figure 10:
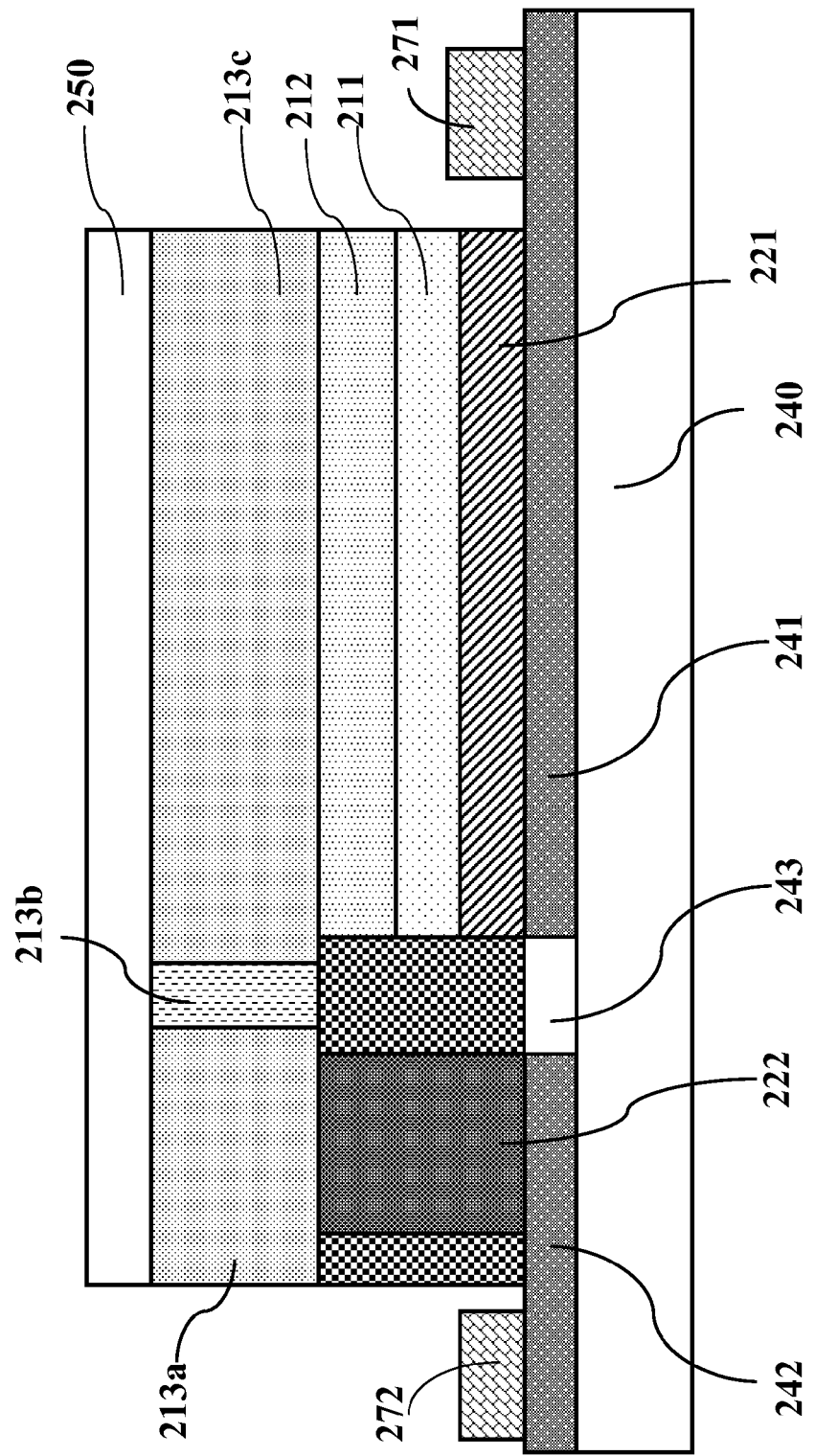
FIG. 10 is schematic diagram of an eighth step in the fabrication process.

As shown in FIG. 10, fabricate a transparent conductive layer 250 over the exposed n-type semiconductor layer 213c in the light-emitting region, the n-type semiconductor layer 213b in the electrode region and the electrically-isolated insulation region 213b. The transparent conductive layer can be ITO or $ZnO_2$, with the preferable thickness of 5000 Å, which connects the n-type semiconductor 213c in the light-emitting region and the n-type semiconductor layer 213a in the electrode region. Therefore, a flip-chip LED grain with vertical current injection into the light-emitting epitaxial layer is formed characterized in that no metal electrode is on the light-emitting surface.

In the LED device of this embodiment, vertical injection of current into the light-emitting epitaxial layer effectively eliminates the current blocking problem in horizontal structure LED device. Further, the light-emitting surface has no pad electrode, which eliminates the electrode light absorption; in addition, the uniplanar P electrode and the N electrode are on the insulating substrate, which effectively improves packing, die bonding and wire bonding yield.

Figure 11:
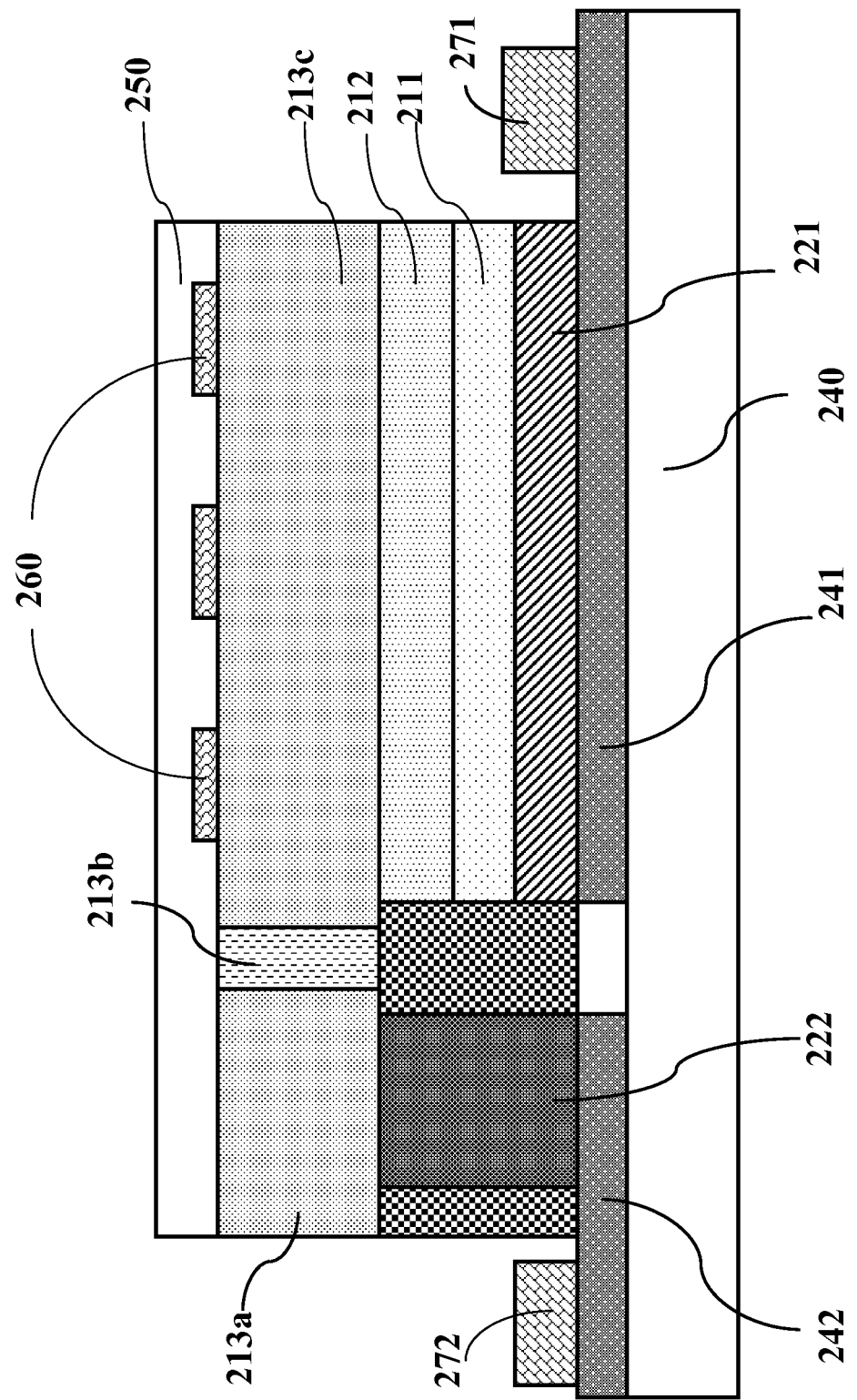
FIG. 11 is a side sectional view of a second embodiment of the present disclosure.

FIG. 11 shows the second embodiment of the present disclosure. In this embodiment, before fabrication of the transparent conductive layer 250, first, fabricate a current expansion structure 260 over the surface of the n-type semiconductor layer 213. The current expansion structure 260 comprises a series of insulation portions made up of insulation and transmitting material like $SiO_2$, $Ga_2O_3$, etc. Further, the insulation portion of the current expansion structure 260 can appear gradient distribution, wherein, the side approaching to the electrode region is most densely distributed and the side away from the electrode region is sparsely distributed.

Figure 12:
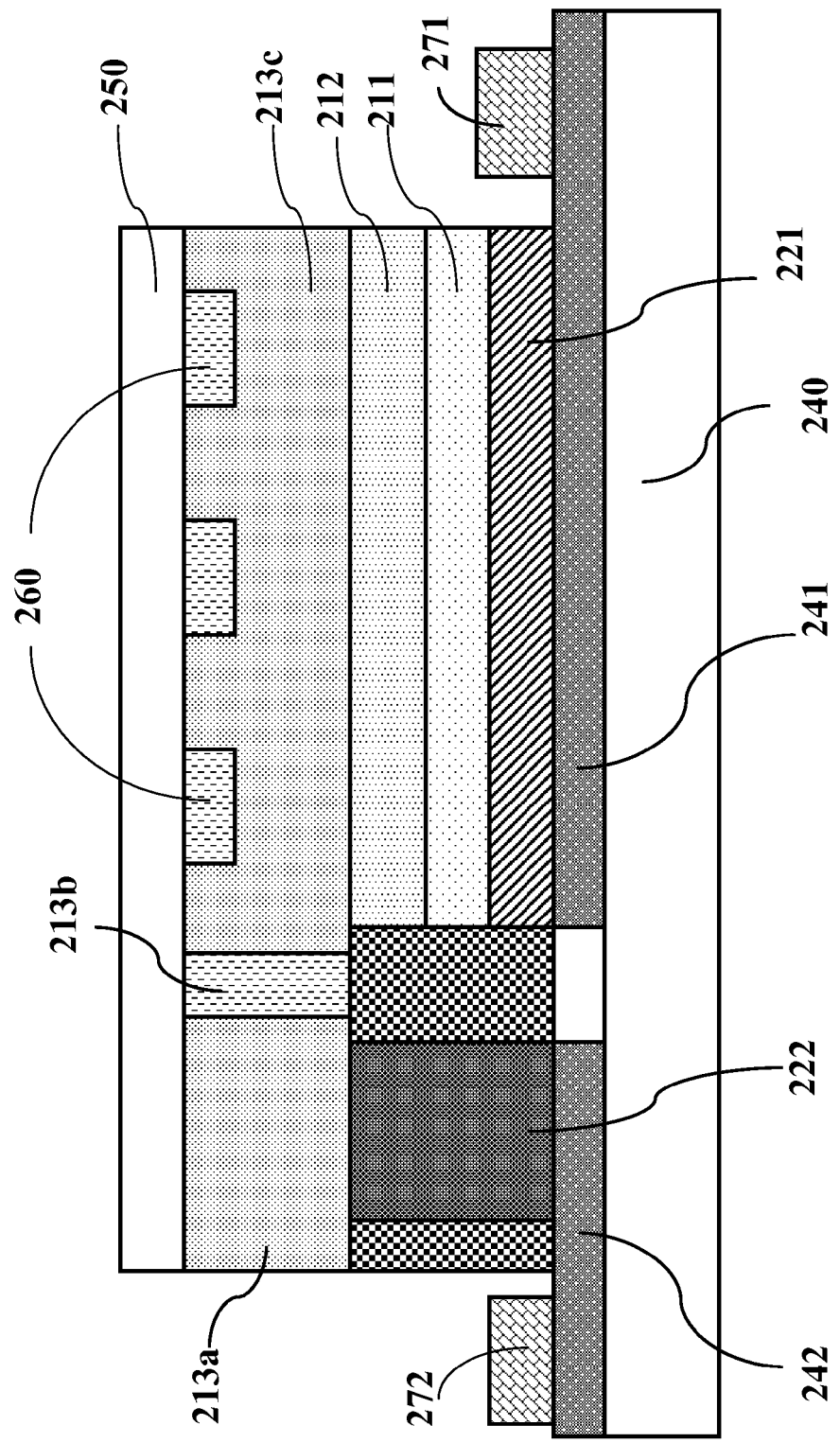
FIG. 12 is a side sectional view of a third embodiment of the present disclosure.

FIG. 12 shows the third embodiment of the present disclosure. Different from the second embodiment, in this embodiment, before fabrication of the transparent conductive layer 250, fabricate a series of insulation portions to form the current expansion structure over the surface of the n-type semiconductor layer via ion injection.

Figure 13:
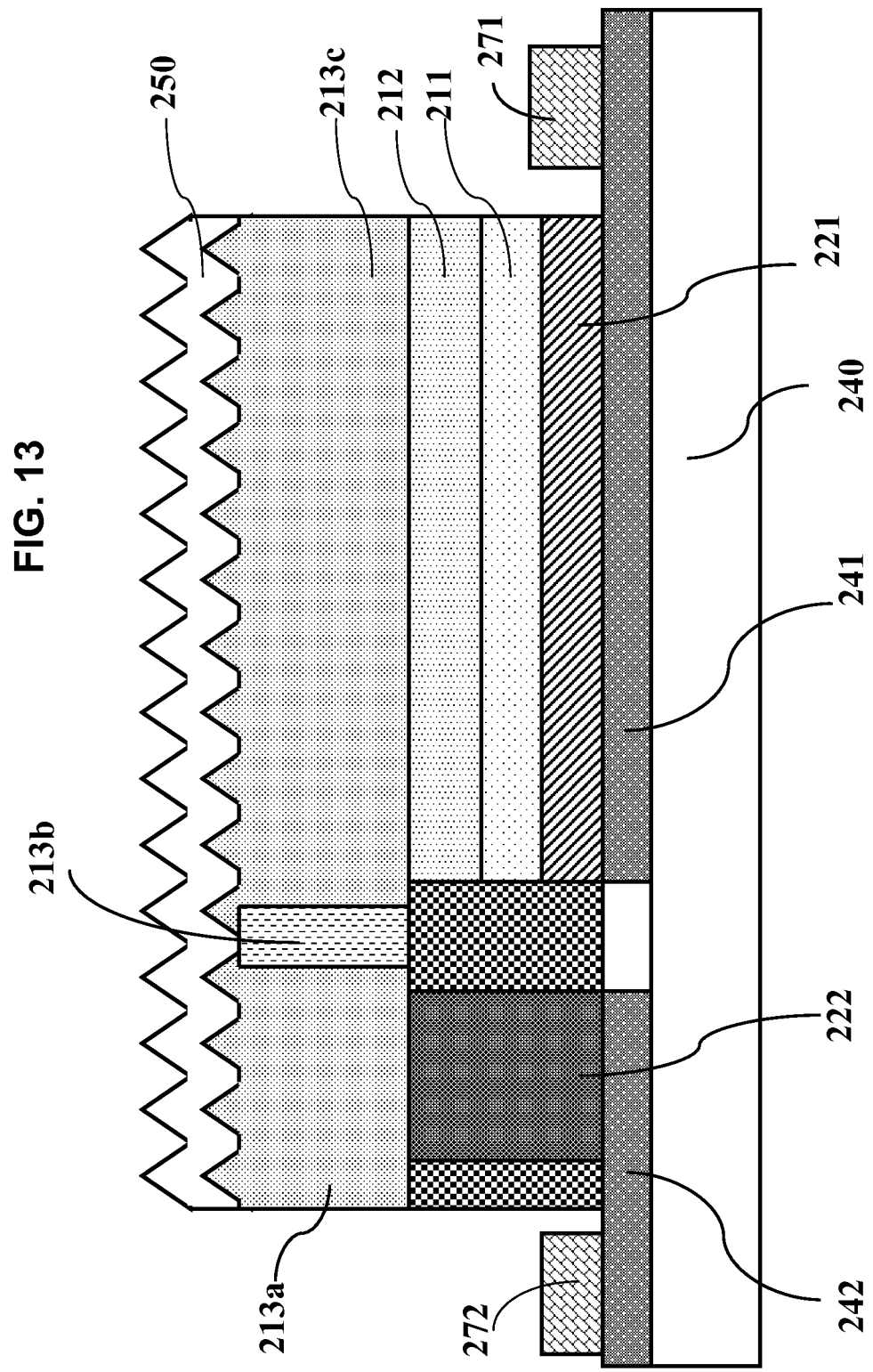
FIG. 13 is a side sectional view of a fourth embodiment of the present disclosure.

FIG. 13 shows the fourth embodiment of the present disclosure. In this embodiment, prior to fabrication of the transparent conductive layer 501, roughen the surface of the n-type semiconductor layer 213 and fabricate a transparent conductive layer 250 over the roughening surface.

Figure 14:
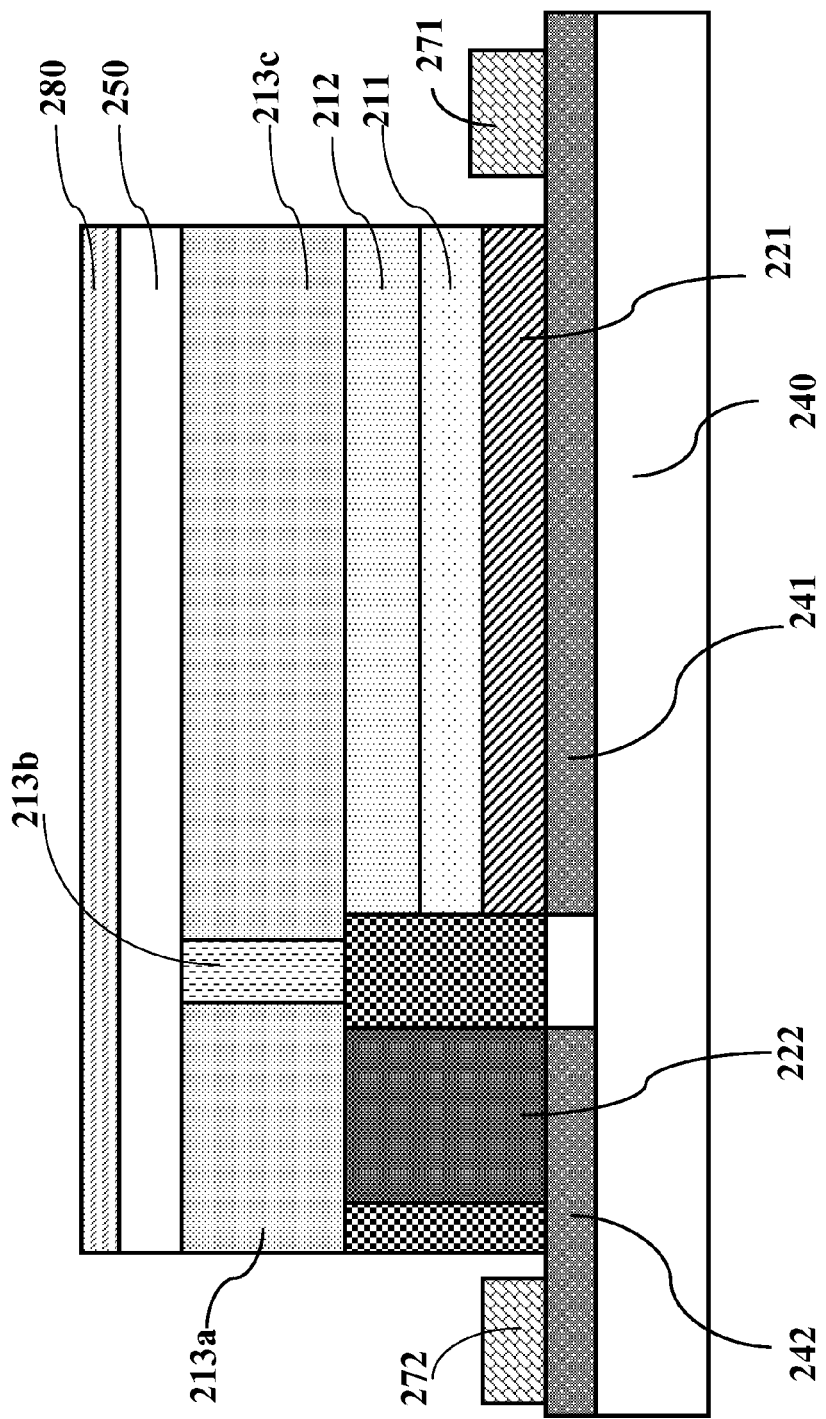
FIG. 14 is a side sectional view of a fifth embodiment of the present disclosure.

FIG. 14 shows the fifth embodiment of the present disclosure. In this embodiment, after fabrication of the transparent conductive layer 260, form a passivation layer 280 over the transparent conductive layer. The passivation layer is made of low-refraction insulation and transmitting material, preferably to be $SiO_2$.

Figure 15:
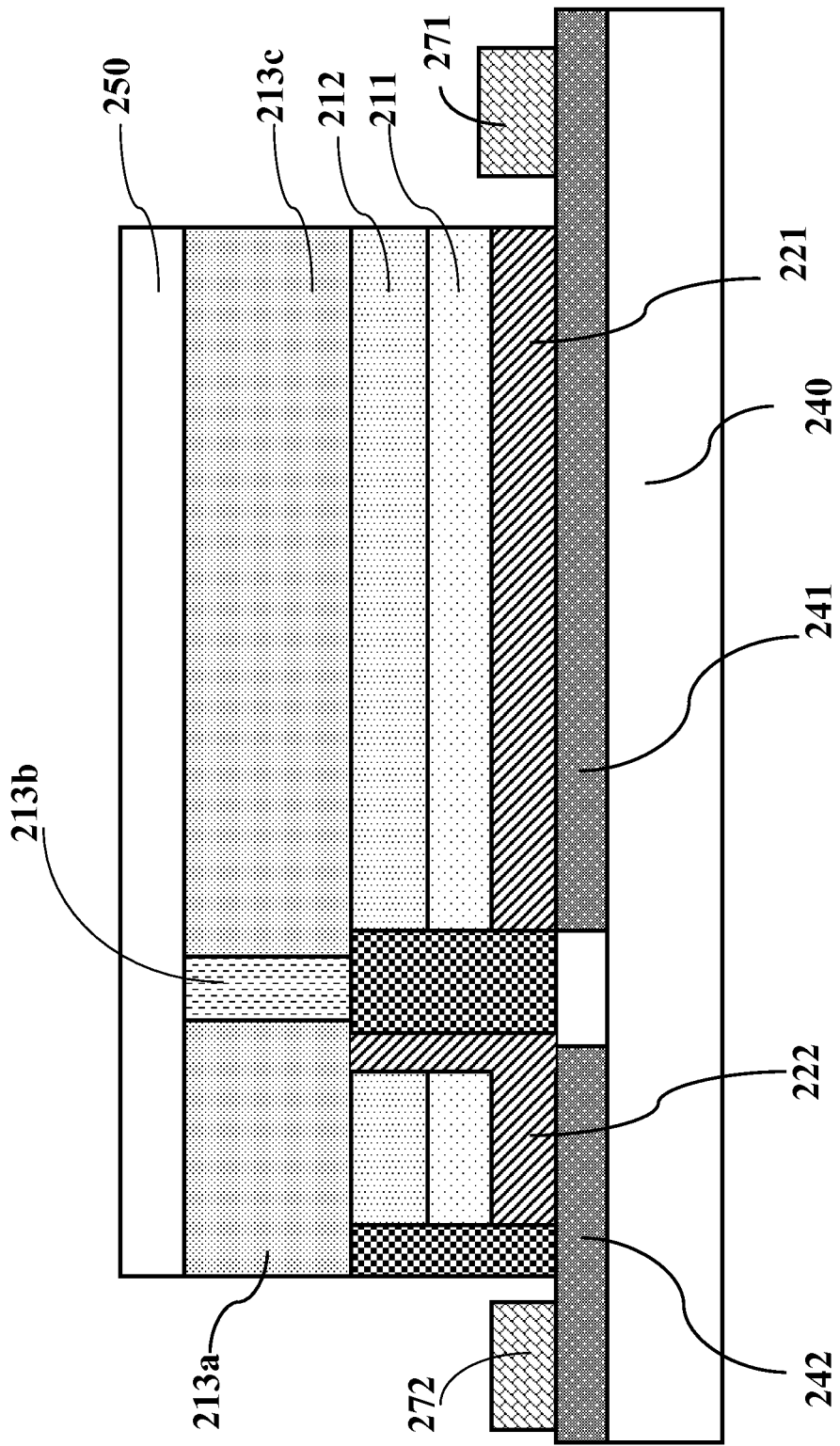
FIG. 15 is a side sectional view of a sixth embodiment of the present disclosure.

FIG. 15 shows the sixth embodiment of the present disclosure. In this embodiment, short circuit the p-type semiconductor in the electrode region and the active layer in replace of the thick N-type bonding metal layer in Embodiment 1. In this way, the P electrode is as high as the N electrode, which is good for electrode fabrication.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A flip-chip light emitting diode (LED), comprising:
a substrate having a P-type pad electrode and an N-type pad electrode disposed thereon;
a light-emitting epitaxial layer flip-chip mounted over the substrate, including an n-type semiconductor layer, an active layer, and a p-type semiconductor layer, wherein the n-type semiconductor layer has a light-emitting region, an isolation region, and an electrode region, wherein the light-emitting region and the electrode region are electrically isolated by the isolation region; wherein the active layer and the p-type semiconductor layer are below the light-emitting region; wherein the p-type semiconductor layer is coupled with the P-type pad electrode; and the electrode region of the n-type semiconductor layer is coupled with the N-type pad electrode;
a conductive connection portion disposed over the n-type semiconductor layer and coupled with the electrode region of the n-type semiconductor layer and the light-emitting region, thereby realizing vertical current injection into the light-emitting epitaxial layer upon application of an external power; and
a current expansion structure distributed at the n-type semiconductor layer in the light-emitting region.

2. The LED of claim 1, wherein: in the n-type semiconductor layer, the isolation region is formed around the electrode region to ensure complete electrical isolation between the electrode region and the light-emitting region.

3. The LED of claim 1, wherein the conductive connection portion is a transparent conductive layer.

4. The LED of claim 3, further comprising a passivation layer over the transparent conductive layer.

5. The LED of claim 1, wherein: the isolation region of the n-type semiconductor layer is formed by an insulation portion via ion injection to realize electrical isolation between the light-emitting region and the electrode region.

6. The LED of claim 1, wherein the n-type semiconductor layer in the electrode region is coupled with the N-type pad electrode on the substrate via a bonding metal layer.

7. The LED of claim 1, wherein the p-type semiconductor layer corresponding to and below the n-type semiconductor layer in the electrode region forms a short circuit connection with the active layer, so as to connect the n-type semiconductor layer in the electrode region and the N-type pad electrode on the substrate.

8. The LED of claim 1, wherein the n-type semiconductor layer in the light-emitting region and the n-type semiconductor layer in the electrode region are epitaxial layers of a same material.

9. A flip-chip light emitting diode (LED), comprising:
a substrate having a P-type pad electrode and an N-type pad electrode disposed thereon;
a light-emitting epitaxial layer flip-chip mounted over the substrate, including an n-type semiconductor layer, an active layer, and a p-type semiconductor layer, wherein the n-type semiconductor layer has a light-emitting region, an isolation region, and an electrode region, wherein the light-emitting region and the electrode region are electrically isolated by the isolation region; wherein the active layer and the p-type semiconductor layer are below the light-emitting region; wherein the p-type semiconductor layer is coupled with the P-type pad electrode; and the electrode region of the n-type semiconductor layer is coupled with the N-type pad electrode;
a conductive connection portion disposed over the n-type semiconductor layer and coupled with the electrode region of the n-type semiconductor layer and the light-emitting region, thereby realizing vertical current injection into the light-emitting epitaxial layer upon application of an external power,
wherein the conductive connection portion is a transparent conductive layer; and
a current expansion structure distributed in the transparent conductive layer.

10. A light emitting system comprising a plurality of flip-chip light emitting diodes (LEDs), each LED including:
a substrate having a P-type pad electrode and an N-type pad electrode disposed thereon;
a light-emitting epitaxial layer flip-chip mounted over the substrate, including an n-type semiconductor layer, an active layer, and a p-type semiconductor layer, wherein the n-type semiconductor layer has a light-emitting region, an isolation region, and an electrode region, wherein the light-emitting region and the electrode region are electrically isolated by the isolation region; wherein the active layer and the p-type semiconductor layer are below the light-emitting region; wherein the p-type semiconductor layer is coupled with the P-type pad electrode; and the electrode region of the n-type semiconductor layer is coupled with the N-type pad electrode;
a conductive connection portion disposed over the n-type semiconductor layer and coupled with the electrode region of the n-type semiconductor layer and the light-emitting region, thereby realizing vertical current injection into the light-emitting epitaxial layer upon application of an external power; and
a current expansion structure distributed at the n-type semiconductor layer in the light-emitting region.

11. The system of claim 10, wherein: in the n-type semiconductor layer, the isolation region is formed around the electrode region to ensure complete electrical isolation between the electrode region and the light-emitting region.

12. The system of claim 10, wherein the conductive connection portion is a transparent conductive layer.

13. The system of claim 12, further comprising a passivation layer over the transparent conductive layer.

14. The system of claim 10, wherein: the isolation region of the n-type semiconductor layer is formed by an insulation portion via ion injection to realize electrical isolation between the light-emitting region and the electrode region.

15. The system of claim 10, wherein the n-type semiconductor layer in the electrode region is coupled with the N-type pad electrode on the substrate via a bonding metal layer.

16. The system of claim 10, wherein the p-type semiconductor layer corresponding to and below the n-type semiconductor layer in the electrode region forms a short circuit connection with the active layer, so as to connect the n-type semiconductor layer in the electrode region and the N-type pad electrode on the substrate, and wherein the n-type semiconductor layer in the light-emitting region and the n-type semiconductor layer in the electrode region are epitaxial layers of a same material.

17. A light emitting system comprising a plurality of flip-chip light emitting diodes (LEDs), each LED including:
- a substrate having a P-type pad electrode and an N-type pad electrode disposed thereon;
- a light-emitting epitaxial layer flip-chip mounted over the substrate, including an n-type semiconductor layer, an active layer, and a p-type semiconductor layer, wherein the n-type semiconductor layer has a light-emitting region, an isolation region, and an electrode region, wherein the light-emitting region and the electrode region are electrically isolated by the isolation region; wherein the active layer and the p-type semiconductor layer are below the light-emitting region; wherein the p-type semiconductor layer is coupled with the P-type pad electrode; and the electrode region of the n-type semiconductor layer is coupled with the N-type pad electrode;
- a conductive connection portion disposed over the n-type semiconductor layer and coupled with the electrode region of the n-type semiconductor layer and the light-emitting region, thereby realizing vertical current injection into the light-emitting epitaxial layer upon application of an external power,
- wherein the conductive connection portion is a transparent conductive layer; and
- a current expansion structure distributed in the transparent conductive layer.

* * * * *